United States Patent
Briano et al.

(10) Patent No.: US 10,753,968 B2
(45) Date of Patent: Aug. 25, 2020

(54) INTEGRATED CIRCUIT HAVING INSULATION BREAKDOWN DETECTION

(71) Applicant: Allegro MicroSystems, LLC, Manchester, NH (US)

(72) Inventors: Robert A. Briano, Auburn, NH (US); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 285 days.

(21) Appl. No.: 15/906,291

(22) Filed: Feb. 27, 2018

(65) Prior Publication Data
US 2019/0265292 A1    Aug. 29, 2019

(51) Int. Cl.
| | |
|---|---|
| *G01R 31/12* | (2020.01) |
| *H02H 1/00* | (2006.01) |
| *H02H 3/16* | (2006.01) |
| *G01R 33/09* | (2006.01) |
| *G01R 33/18* | (2006.01) |

(52) U.S. Cl.
CPC .......... *G01R 31/129* (2013.01); *G01R 33/09* (2013.01); *G01R 33/093* (2013.01); *G01R 33/18* (2013.01); *H02H 1/0007* (2013.01); *H02H 3/16* (2013.01)

(58) Field of Classification Search
CPC ...... G01R 31/129; G01R 31/12; G01R 33/09; G01R 33/093; G01R 33/18
See application file for complete search history.

(56) References Cited

U.S. PATENT DOCUMENTS

| | | | |
|---|---|---|---|
| 6,252,390 B1 | 6/2001 | Black, Jr. et al. | |
| 6,873,065 B2 | 3/2005 | Haigh et al. | |
| 7,259,545 B2 | 8/2007 | Stauth et al. | |
| 7,768,083 B2 | 8/2010 | Doogue et al. | |
| 7,973,527 B2 | 7/2011 | Taylor et al. | |
| 8,063,634 B2 | 11/2011 | Sauber et al. | |
| 8,358,129 B2 * | 1/2013 | Imai .................. | B82Y 25/00 324/244 |
| 8,629,520 B2 | 1/2014 | Doogue et al. | |
| 8,952,471 B2 | 2/2015 | Doogue et al. | |
| 9,082,957 B2 | 7/2015 | Doogue et al. | |
| 9,367,386 B2 | 6/2016 | Kaeriyama | |
| 9,829,531 B2 * | 11/2017 | Alini ................. | G01R 31/1263 |
| 9,859,489 B2 | 1/2018 | Doogue et al. | |
| 9,941,999 B1 | 4/2018 | Milesi et al. | |
| 2006/0061350 A1 | 3/2006 | Myers et al. | |

(Continued)

OTHER PUBLICATIONS

Response to Official Communication dated Sep. 2, 2019 and Extended European Search Report (EESR) dated Jun. 28, 2019 for European Application No. 19158387.1; Response filed Feb. 25, 2020; 13 Pages.
U.S. Appl. No. 16/267,412, filed Feb. 5, 2019, Briano.
Bender GmbH, ISOMETER® IR155-3203/IR155-3204 Product Data Sheet; Insulation Monitoring Device (IMD) for Unearthed DC Drive Systems (IT Systems) in Electric Vehicles; Version V004; Feb. 2018; 6 Pages.
U.S. Appl. No. 15/363,208, filed Nov. 29, 2016, Latham et al.
U.S. Appl. No. 15/671,357, filed Aug. 8, 2017, Briano.
U.S. Appl. No. 15/705,487, filed Sep. 15, 2017, Briano.

(Continued)

*Primary Examiner* — Scott Bauer
(74) *Attorney, Agent, or Firm* — Daly Crowley Mofford & Durkee, LLP

(57) ABSTRACT

Methods and apparatus for an integrated circuit having first and second domains with an insulative material electrically isolating the first and second domains. A conductive shield is disposed between the first and second domains and a current sensor has at least one magnetoresistive element proximate the shield to detect current flow in the shield due to breakdown of the insulative material.

24 Claims, 4 Drawing Sheets

(56) References Cited

U.S. PATENT DOCUMENTS

| | | | |
|---|---|---|---|
| 2013/0033791 A1* | 2/2013 | Alini | H04L 25/0266 |
| | | | 361/90 |
| 2013/0055052 A1* | 2/2013 | Kaeriyama | H03K 17/78 |
| | | | 714/799 |
| 2016/0003887 A1* | 1/2016 | Nagase | G01R 31/50 |
| | | | 327/546 |
| 2017/0110652 A1 | 4/2017 | Doogue et al. | |
| 2018/0076176 A1 | 3/2018 | Latham et al. | |
| 2018/0076909 A1 | 3/2018 | Latham et al. | |
| 2019/0096910 A1* | 3/2019 | Imanishi | H01L 27/1203 |

OTHER PUBLICATIONS

U.S. Appl. No. 15/909,178, filed Mar. 1, 2018, Milesi et al.
U.S. Appl. No. 15/689,185, filed Aug. 29, 2017, Chetlur et al.
U.S. Appl. No. 15/801,679, filed Nov. 2, 2017, Briano.
Jim Daughton, "Spin-Dependent Sensors," Proceedings of the IEEE, vol. 91, No. 5; May 2003; pp. 681-686; 6 Pages.
U.S. Appl. No. 16/430,849, filed Jun. 4, 2019, Briano et al.
Daughton et al., "Applications of Spin Dependent Transport Materials;" Journal of Physics D Applied Physics, vol. 32, No. 22; Nov. 1999; pp. R169-R177; 9 Pages.
Extended European Search Report dated Jun. 28, 2019 for European Application No. 19158387.1; 8 Pages.

* cited by examiner

INTEGRATED CIRCUIT HAVING INSULATION BREAKDOWN DETECTION

BACKGROUND

As is known in the art, integrated circuits can include an insulative material to electrically isolate one domain from another. The domains can be at different voltage potentials. As the insulative material breaks down, the electrical isolation of the regions can be degraded, which can impair operation of the insulative material. In some cases, breakdown of the insulative material may create dangerous conditions.

SUMMARY

The present invention provides method and apparatus for an integrated circuit to detect breakdown of an insulation system on the integrated circuit used for signal isolation. It is understood that embodiments of the invention are directed to insulation breakdown that is a relatively 'instantaneous' event as opposed to relatively slow degradation over time.

In embodiments, the isolated integrated circuit can be disconnected to protect a lower of high and low voltage domains, for example. In embodiments, a signal isolator integrated circuit package includes high and low voltage domains isolated by a layer of insulative material with a detection module to detect breakdown of the insulative material. In some embodiments, current flow corresponding to insulation breakdown is latched to hold the state while disconnection of the higher voltage domain can occur, for example.

In an embodiment, a signal isolator integrated circuit includes high and low voltage domains with conductive structures for data transmission on each side; which could include in one of each of the voltage domains a coil and current sensor, two coils for magnetic coupling or capacitor plates for capacitive coupling; separated by an insulative material and an insulation breakdown detection module. It is understood that any of the conductive structures could be used for data transmission; for the purposes of illustration the coil and current sensor will be used as the preferred method of data transmission. In embodiments, the integrated circuit can be used for isolating digital or analog signals, with one or more integrated circuit chips in a single package. In embodiments, the insulating layer comprises a polymer, ceramic, oxide or other suitable material. The voltage between the domains can depend on the application in which the signal isolator is used. As the isolation material breaks down, electrical isolation between the circuits of the high and low voltage domains is compromised. The higher voltage can create current flow with the potential to harm circuitry on the lower voltage domain.

In embodiments, a current detection module of the integrated circuit can detect current flow from the high voltage side to the low voltage side as insulation breaks down. In some embodiments, an integrated circuit can include an electric shield comprising a conductive material between the isolated circuits. The shield shunts current to a node, such as ground. The current detection module can include a current sensor proximate the shield carrying the breakdown current to detect the flow of current.

In embodiments, the current sensor comprises a magnetoresistive material which changes impedance due to the flow of the breakdown current. This change in impedance can be used to detect breakdown current flow and to disconnect the isolated circuits from each other. For example, a relay or other suitable device can be used for circuit disconnection. In embodiments, the current sensor includes a magnetoresistive element to provide a bi-stable current sensor. The detected current signal latches the breakdown current flow sustaining the detection of the breakdown current flow. To detect a breakdown current flow of either polarity, first and second magnetoresistive devices can be positioned adjacent to the current flow in inverse orientations to the current flow and electrically in parallel. If either one of the inverse magnetoresistive devices detects current flow, the total resistance across the magnetoresistive element will change In one aspect of the invention, an integrated circuit, comprising: a first domain; a second domain; an insulative material electrically isolating the first and second domains; a conductive shield between the first and second domains; a current sensor having at least one magnetoresistive element proximate the shield to detect current flow in the shield due to breakdown of the insulative material.

An integrated circuit can further include one or more of the following features: the integrated circuit comprises a signal isolator, the magnetoresistive element comprises a bi-stable latch, at least one switch to selectively connect and disconnect the first and second domains, at least one magnetoresistive element includes a first magnetoresistive element to detect the current flow in a first direction and a second magnetoresistive element to detect the current flow in a second direction, which is opposite to the first direction, a first breakdown condition corresponds to the current flow in the first direction above a first threshold, a second breakdown condition corresponds to the current flow in the second direction above a second threshold, the first domain comprises a first conductive structure and the second domain comprises a second conductive structure, and wherein the shield is disposed between the first and second conductive structure, and/or the shield is offset a given lateral distance from a vertical alignment of the first and second conductive structure. The conductive structure is part of a data transmission mechanism, and can be first and second coils magnetically coupled or first and second capacitive plates.

In another aspect, a method comprises: employing a first domain and a second domain; employing an insulative material electrically isolating the first and second domains; employing a conductive shield between the first and second domains; and employing a current sensor having at least one magnetoresistive element proximate the shield to detect current flow in the shield due to breakdown of the insulative material.

A method can further include one or more of the following features: the integrated circuit comprises a signal isolator, the magnetoresistive element comprises a bi-stable latch, at least one switch to selectively connect and disconnect the first and second domains, the at least one magnetoresistive element includes a first magnetoresistive element to detect the current flow in a first direction and a second magnetoresistive element to detect the current flow in a second direction, which is opposite to the first direction, a first breakdown condition corresponds to the current flow in the first direction above a first threshold, a second breakdown condition corresponds to the current flow in the second direction above a second threshold, the first domain comprises a first coil and the second domain comprises a second coil magnetically coupled to the first coil, and wherein the shield is disposed between the first and second coils, and/or the shield is offset a given lateral distance from a vertical alignment of the first and second coils.

In a further aspect, a device comprises: a first domain; a second domain; an insulator means for electrically isolating the first and second domains; a conductive shield means between the first and second domains; a current sensor means having at least one magnetoresistive element proximate the shield means for detecting current flow in the shield due to breakdown of the insulator means.

BRIEF DESCRIPTION OF THE DRAWINGS

The foregoing features of this invention, as well as the invention itself, may be more fully understood from the following description of the drawings in which.

DETAILED DESCRIPTION

Figure 1:
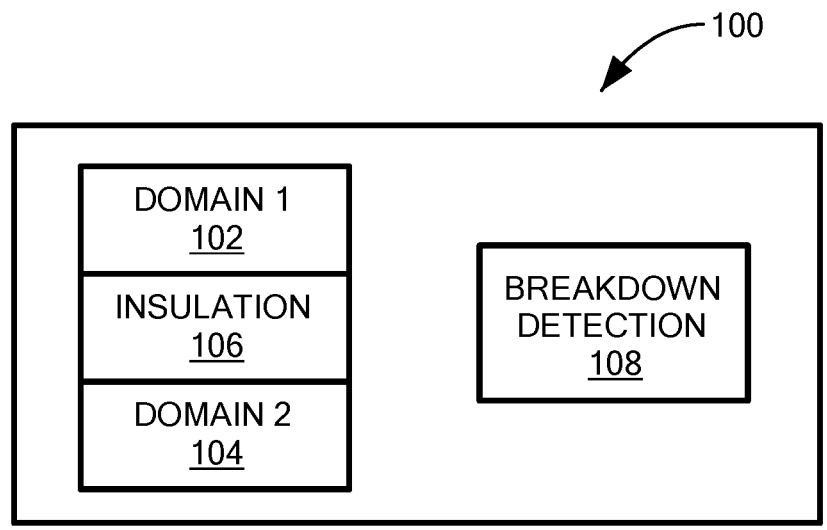
FIG. 1 is a block diagram of an example system including first and second domains separated by insulative material and a breakdown detection module to detect breakdown of the insulative material.

FIG. 1 shows an example system 100 having first and second domains 102, 104 electrically isolated by an insulative material 106, which can be provided in a layer. The system 100 further includes a breakdown detection module 108 to detect breakdown of the insulative material 106 which can reside in one of the domains. In embodiments, a current can flow between the first and second domains 102, 104 due to breakdown of the insulative material 106. The breakdown detection module 108 can include a current sensor to detect the current flow between the first and second domains 102, 104.

It is understood that the term "domain" should be construed broadly to include any circuitry associated with a particular circuit supply voltage, at a particular voltage level that is completely separated from another circuit with a different power supply voltage, generally at a different voltage level. The separation can be for safety or functional purposes. In embodiments, the first domain 102 includes circuitry configured, at least in part, for operation at a first voltage level and the second domain 104 includes circuitry configured, at least in part, for operation at a second voltage level. The first and second voltage levels can be different voltage levels. In embodiments, the first and second domains 102, 104 can be provided on different die, or the same die. An example voltage range of operation is from about 5V in one domain to about 60V to many kilovolts for safety isolation. For functional isolation, both domains would generally have a voltage differential of <60V.

Figure 2:
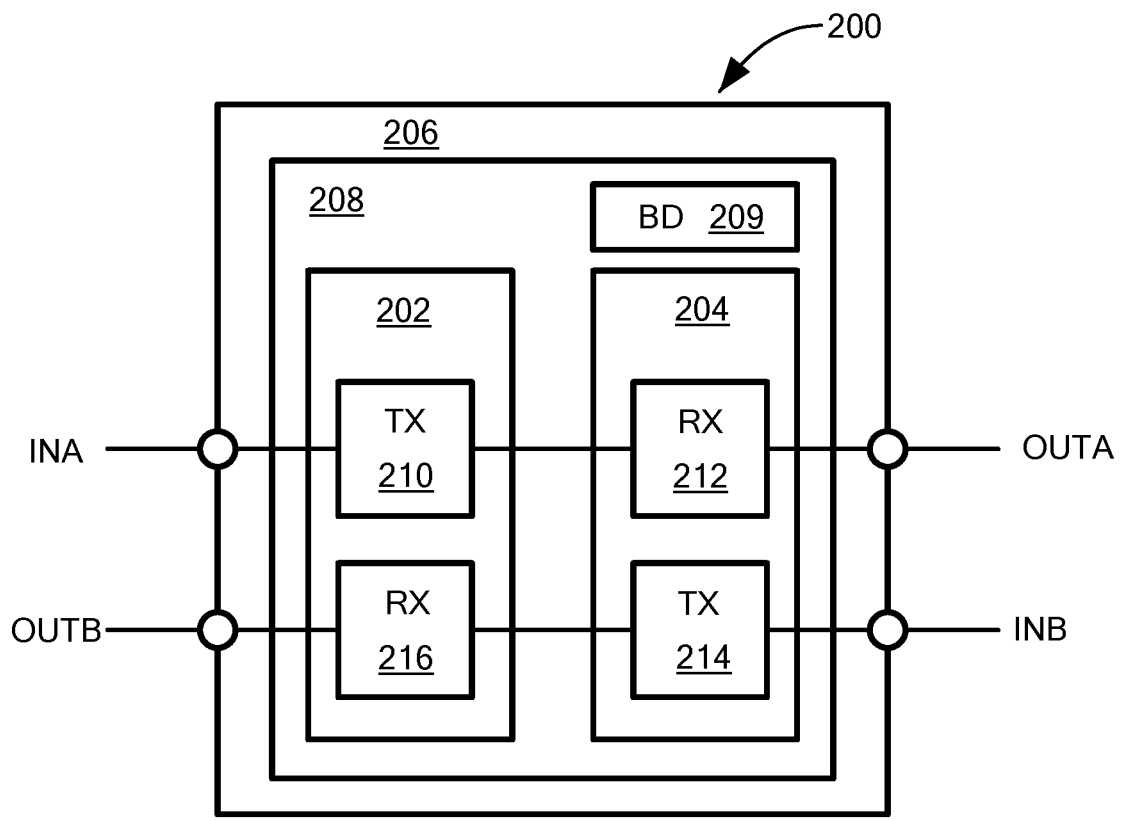
FIG. 2 is a schematic representation of an example signal isolator integrated circuit having a breakdown detection module to detect breakdown of an insulative material.

FIG. 2 shows an example signal isolator 200 having insulative material breakdown material in accordance with example embodiments of the invention. The signal isolator 200 includes first and second die 202, 204 that form part of an integrated circuit package 206. In an embodiment, the IC package 206 includes a first input signal INA connected to the first die 202 and a first output signal OUTA connected to the second die 204. The IC package 206 further includes a second input signal INB connected to the second die 204 and a second output signal OUTB to the first die 204. The first and second die 202, 204 are separated by a barrier region 208, such as an isolation barrier formed of an insulative material. The IC package 206 includes an isolation breakdown module 209 to detect current flow between the first and second die 202, 204 due to breakdown of the isolation barrier 208, as described more fully below.

It is understood that signal isolator includes any device that provides signal isolation for analog, digital, sensing element isolators, and the like.

In embodiments, the first die 202 includes a first transmit module 210 and the second die includes a first receive module 212 that provides a signal path from the first input signal INA to the first output signal OUTA across the barrier 208. The second die 204 includes a second transmit module 214 and the first die 204 includes a second receive module 216 that provides a signal path from the second input signal INB to the second output signal OUTB across the barrier 208.

It is understood that any practical number of transmit, receive, and transmit/receive modules can be formed on the first and/or second die to meet the needs of a particular application. It is further understood that transmit, receive, and transmit/receive modules can comprise the same or different components. In addition, in embodiments, bi-directional communication is provided across the barrier. Further, circuitry in the first and/or second die can be provided to process signals, perform routing of signals, and the like. In some embodiments, sensing elements are formed in, on, or about the first and/or second die.

FIG. 2 shows an example signal isolator 200 having magnetic signal latching of signals from a transmitter 202 to a receiver 204 separated by an isolation barrier 206. In embodiments, the transmitter 202 is disposed on a first die 208 and the receiver 204 is disposed on a second die 210, where the first and second die have different voltage domains.

Figure 3A:
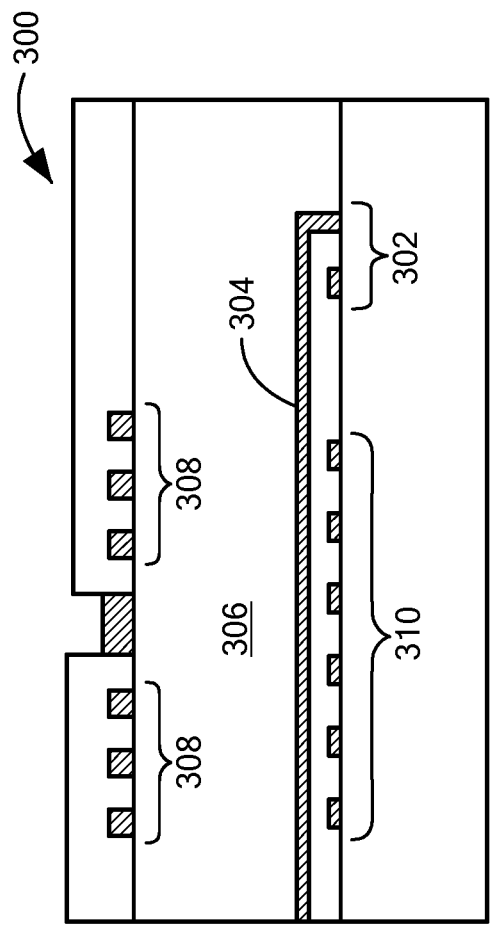
FIGS. 3A and 3B are schematic representations showing an example signal isolator integrated circuit having a breakdown detection module to detect breakdown of an insulative material.
Figure 3B:
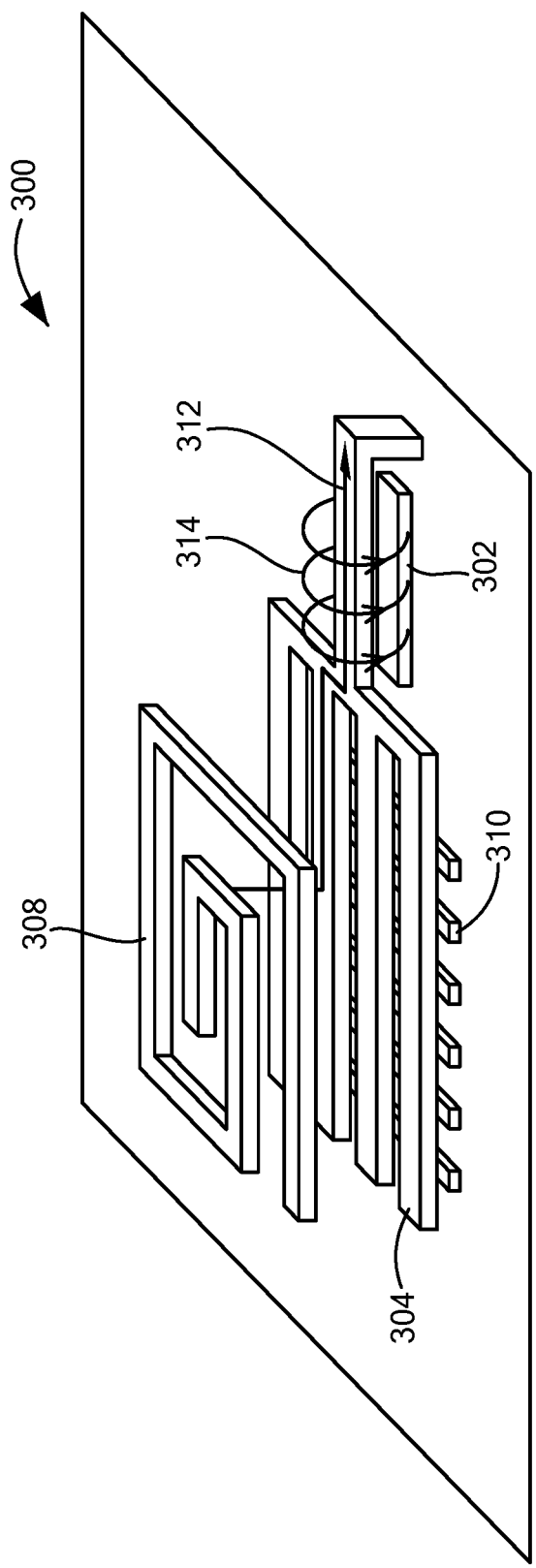

FIGS. 3A and 3B show an example signal isolator 300 having a magnetoresistive (MR) sensor 302 proximate a conductive shield 304 for detecting current flow due to breakdown of a dielectric layer 306 between a transmit coil 308 and a receive coil 310. In embodiments, the transmit coil 308 can be provided as the transmitter 210 of FIG. 2 and the receive coil 310 can be provided as the receiver 212 of FIG. 2.

As the insulating capability of the dielectric layer 306 breaks down, a current can flow, for example, in the conductive shield 304, as indicated by arrow 312 (FIG. 3B). As shown in FIG. 3B, the current flow 312 generates a magnetic field 314. In embodiments, the magnetoresistive sensor 302 detects the magnetic field 314 from the current flow 312 for detecting the insulation 306 breakdown. In embodiments, the magnetoresistive sensor 302 is located a given distance from an overlap of the transmit and receive coils 308, 310. In the illustrated embodiment, the magnetoresistive sensor 302 is a distance to the right of the vertical alignment of the transmit and receive coils 308, 310. In embodiments, the magnetoresistive sensor 302 comprises a bi-stable magnetoresistive element.

It is understood that the transmit and receive coils can have any suitable configuration in the number of coils, thickness, geometry, etc., to meet the needs of a particular application. It is further understood that example insulative materials comprise Polyimide, BCB, silicon oxide (including but not limited to SIO2), silicon nitride, and any combinations thereof.

Figure 4A:
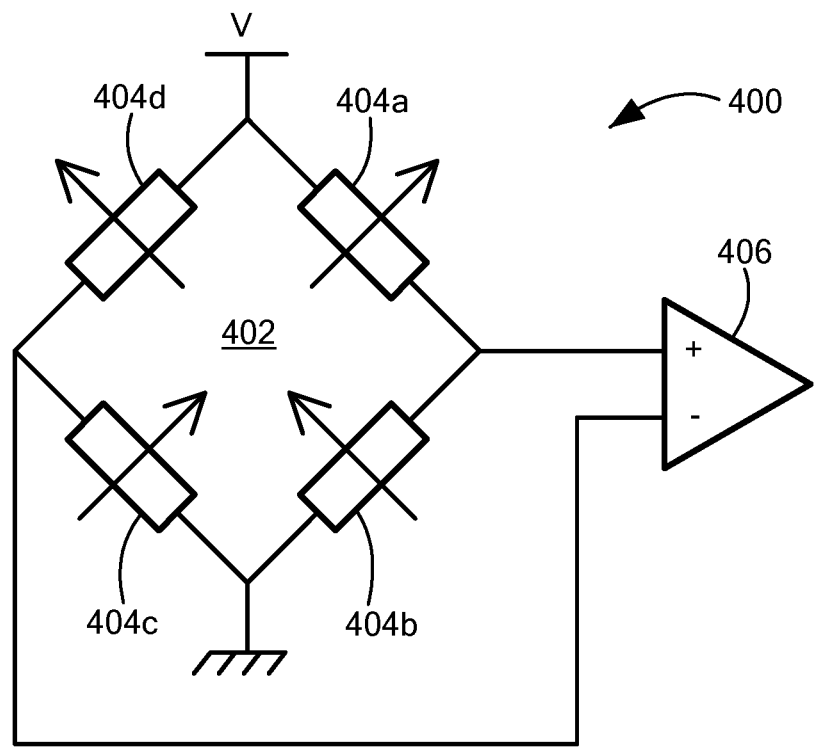
FIG. 4A is a schematic representation of an example magnetic field sensing element that can form a portion of the signal isolator of FIG. 2.
Figure 4B:
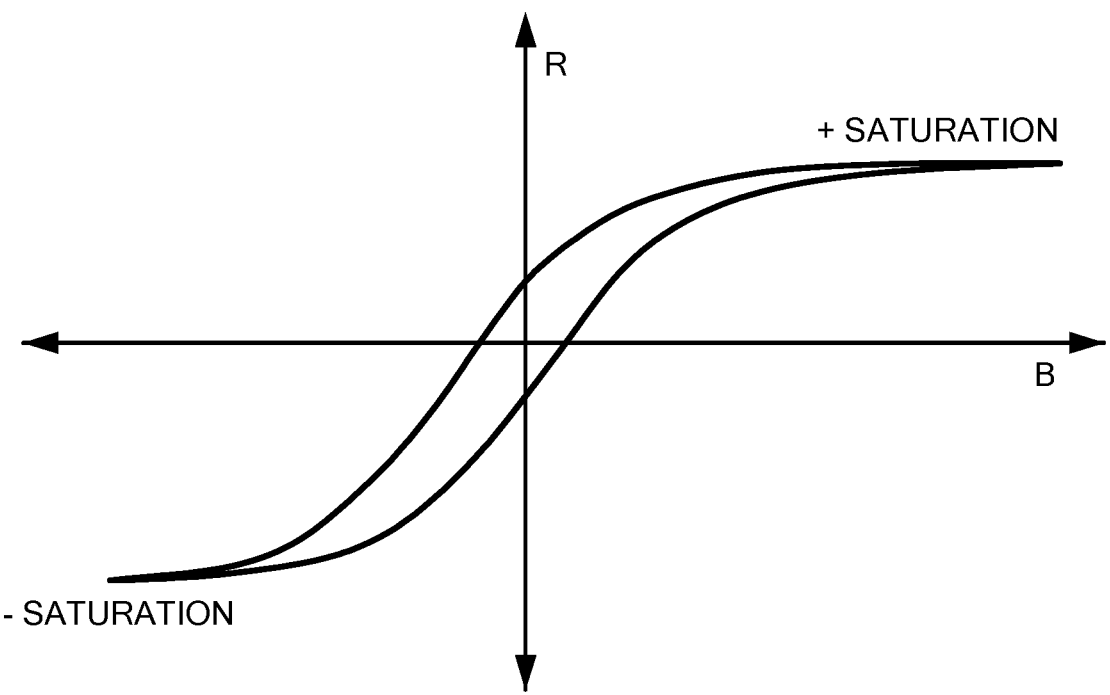
FIG. 4B is a waveform diagram of an example transfer function for the magnetic field sensing element of FIG. 4A.

FIG. 4A shows an example magnetoresistive sensor 400 of a signal isolator having a bridge configuration 402. MR elements 404a and 404c will saturate in one direction and MR elements 404b and 404d will saturate in the opposite direction. These saturation levels will be latched, i.e. remain in state, until an opposite magnetic field of large enough amplitude overcomes the coercive force of the MR element, as shown in FIG. 4B, changing the state of the MR magnetic latch. In the illustrative embodiments, these opposite states of the magnetorestive sensing elements 404a-d are coupled to an amplifier or comparator 406 to generate an output voltage equal to the latched state of the MR elements. FIG. 4B shows an example bi-stable latch that holds a first state until transitioned to a second state.

Figure 5:
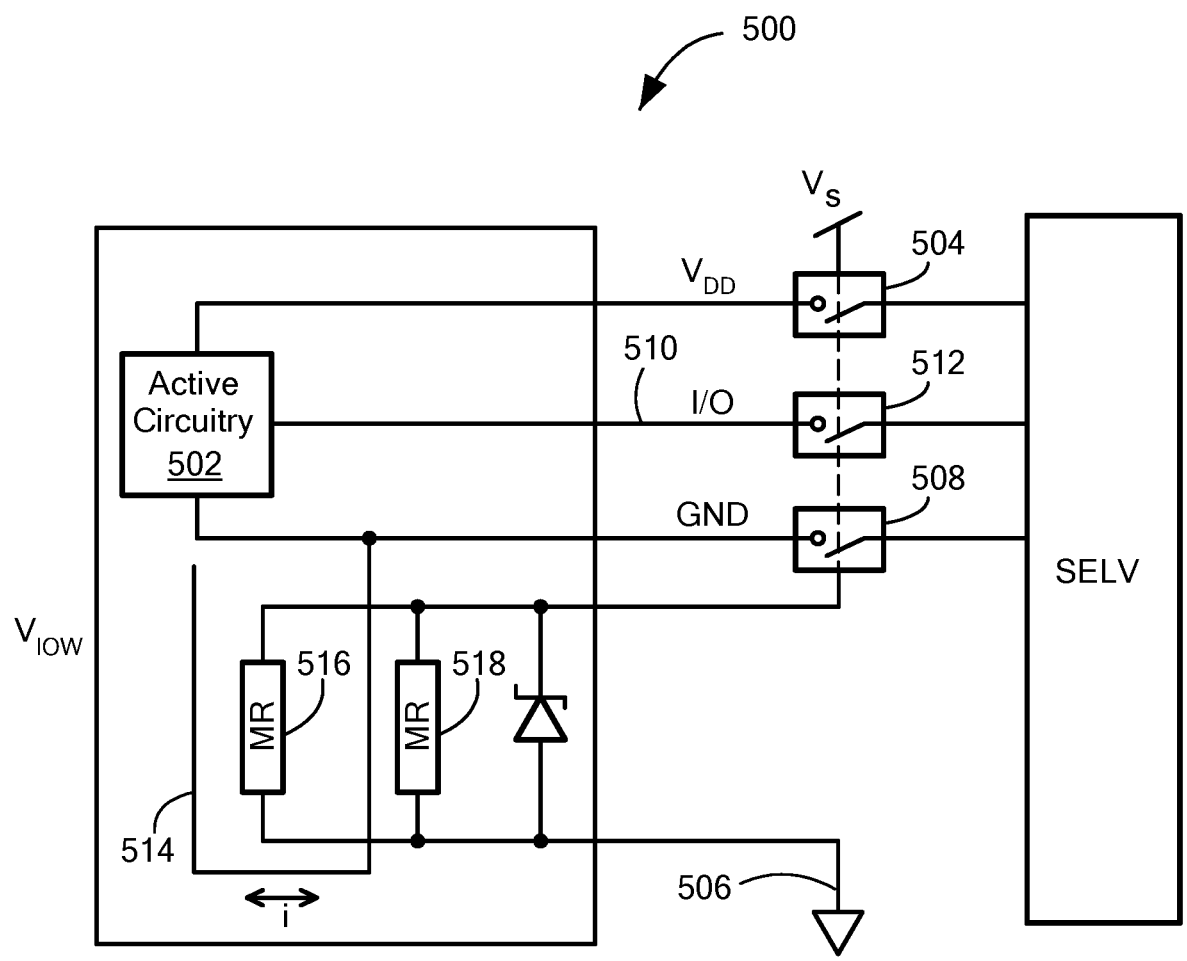
FIG. 5 is a schematic representation of an example circuit having a breakdown detection module to detect breakdown of an insulative material and an example circuit to disconnect the domains in case of a breakdown.

FIG. 5 shows an example circuit 500 having insulation breakdown detection in accordance with example embodiments of the invention. The circuit 500 includes active circuitry 502, e.g., the signal isolator circuitry, coupled to a supply voltage Vs via a first switch 504 and ground 506 via a second switch 508. The active circuitry 502 also includes an I/O signal 510 coupled to a SELV (safety extra-low voltage) circuit via a third switch 512. In embodiments, the breakdown detection circuitry is passive. In general, the active circuitry will be damaged by insulation breakdown.

The circuit 500 includes a conductive shield 514 coupled to ground 506. A first magnetic field sensor 516 having a first orientation is proximate the shield 514 at a first position and a second magnetic field sensor 518 having a second orientation is proximate the shield at a second position. The first magnetic field sensor 516 detects current flow in the shield 514 in a first direction and the second magnetic field sensor 518 detects current flow in the shield in the opposite direction. Based upon whether the current flow is above a given threshold, for example the switches 504, 508, 512 can be controlled to open. For example, if the current flow is above a first threshold in the first direction, the first magnetic field sensor 516 can change state. Based on the change of state, the switches can be opened to prevent damage to the SELV circuit, for example, due to breakdown of insulative material. Similarly, current flow above a second threshold in the opposite direction can be detected by the second magnetic field sensor 518.

As the magnetoresistive elements change in impedance due to current flow in the shield, the circuit connections can be disconnected so that the isolated circuits are not damaged. Switches, relays, and the like can be used to selectively connect and disconnect the isolated circuits. In embodiments, magnetoresistive elements can provide a bi-stable current sensor for latching a detected current signal corresponding to insulation breakdown current flow.

Embodiments of the invention provide detection of breakdown of an insulative material of an integrated circuit. The integrated circuit can be provided, for example, as a signal isolator for isolating digital and/or analog signals or sensors. One or more integrated circuit chips can be provided in a single package. The voltage differential between first and second domains can be relatively high depending on the application so as to result in breakdown of the dielectric material and decreased electrical isolation. As isolation capability breaks down, current can flow between the circuits at different voltage levels potentially damaging circuitry or creating hazardous conditions. Current flow can advantageously be detected using at least one conductive shield and at least one current sensor in an integrated circuit package.

It is understood that the magnetic field sensing elements can comprise any suitable magnetoresistive technologies, including AMR, GMR, TMR, or other magnetoresistive technology. By using a magnetoresistive latch to hold current breakdown data, data can be preserved during external events that disrupt the electrical operation of the active circuitry. Example transmissions can be provided as pulsed current, direct current, continuous frequency (e.g., On-off-Keying or OOK) or other suitable data transmission method.

While example embodiments are shown having a transmitter and receiver on separate die, in other embodiments, they are on the same die. In addition, each die can have any combination of drivers and receivers and each driver and receiver data transmission channel can share features for each individual data channel. In embodiments, outputs can be in buffered with a push-pull, open drain or other such output driver, or the output can be a magnetoresistive device with change in resistance indicating logic states.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable sub-combination. Other embodiments not specifically described herein are also within the scope of the following claims.

What is claimed is:

1. An integrated circuit, comprising:
   a first domain;
   a second domain;
   an insulative material electrically isolating the first and second domains;
   a conductive shield between the first and second domains; and
   a current sensor having at least one magnetoresistive element proximate the shield to detect current flow in the shield due to breakdown of the insulative material.

2. The integrated circuit according to claim 1, wherein the integrated circuit comprises a signal isolator.

3. The integrated circuit according to claim 1, wherein the magnetoresistive element comprises a bi-stable latch.

4. The integrated circuit according to claim 1, further including at least one switch to selectively connect and disconnect the first and second domains.

5. The integrated circuit according to claim 1, wherein the at least one magnetoresistive element includes a first magnetoresistive element to detect the current flow in a first direction and a second magnetoresistive element to detect the current flow in a second direction, which is opposite to the first direction.

6. The integrated circuit according to claim 5, wherein a first breakdown condition corresponds to the current flow in the first direction above a first threshold.

7. The integrated circuit according to claim 6, wherein a second breakdown condition corresponds to the current flow in the second direction above a second threshold.

8. The integrated circuit according to claim 1, wherein the first domain comprises a first coil and the second domain comprises a second coil magnetically coupled to the first coil, and wherein the shield is disposed between the first and second coils.

9. The integrated circuit according to claim 8, wherein the shield is offset a given lateral distance from a vertical alignment of the first and second coils.

10. The integrated circuit according to claim 1, wherein the insulative material includes at least two different materials.

11. A method, comprising:
employing a first domain and a second domain;
employing an insulative material electrically isolating the first and second domains;
employing a conductive shield between the first and second domains; and
employing a current sensor having at least one magnetoresistive element proximate the shield to detect current flow in the shield due to breakdown of the insulative material.

12. The method according to claim 11, wherein the integrated circuit comprises a signal isolator.

13. The method according to claim 11, wherein the magnetoresistive element comprises a bi-stable latch.

14. The method according to claim 11, further including at least one switch to selectively connect and disconnect the first and second domains.

15. The method according to claim 11, wherein the at least one magnetoresistive element includes a first magnetoresistive element to detect the current flow in a first direction and a second magnetoresistive element to detect the current flow in a second direction, which is opposite to the first direction.

16. The method according to claim 11, wherein a first breakdown condition corresponds to the current flow in the first direction above a first threshold.

17. The method according to claim 16, wherein a second breakdown condition corresponds to the current flow in the second direction above a second threshold.

18. The method according to claim 11, wherein the first domain comprises a first coil and the second domain comprises a second coil magnetically coupled to the first coil, and wherein the shield is disposed between the first and second coils.

19. The method according to claim 18, wherein the shield is offset a given lateral distance from a vertical alignment of the first and second coils.

20. A device, comprising:
a first domain;
a second domain;
an insulator means for electrically isolating the first and second domains;
a conductive shield means between the first and second domains; and
a current sensor means having at least one magnetoresistive element proximate the shield means for detecting current flow in the shield due to breakdown of the insulator means.

21. The device according to claim 20, wherein the device comprises a signal isolator.

22. The device according to claim 20, wherein the at least one magnetoresistive element comprises a bi-stable latch.

23. The device according to claim 20, further including at least one switch to selectively connect and disconnect the first and second domains.

24. The device according to claim 20, wherein the at least one magnetoresistive element includes a first magnetoresistive element to detect the current flow in a first direction and a second magnetoresistive element to detect the current flow in a second direction, which is opposite to the first direction.

\* \* \* \* \*